US012738895B2

(12) United States Patent
Maalouf et al.

(10) Patent No.: US 12,738,895 B2
(45) Date of Patent: Sep. 15, 2026

(54) RADIO-FREQUENCY AMPLIFIERS WITH AUTOMATIC BIAS COMPENSATION

(71) Applicant: NXP USA, Inc., Austin, TX (US)

(72) Inventors: Elie A. Maalouf, Mesa, AZ (US); Xu Jason Ma, Chandler, AZ (US)

(73) Assignee: NXP B.V., Eindhoven (NL)

( * ) Notice: Subject to any disclaimer, the term of this patent is extended or adjusted under 35 U.S.C. 154(b) by 362 days.

(21) Appl. No.: 18/634,401

(22) Filed: Apr. 12, 2024

(65) Prior Publication Data

US 2025/0323602 A1 Oct. 16, 2025

(51) Int. Cl.
*H03F 1/30* (2006.01)
*H03F 1/02* (2006.01)
*H03F 3/24* (2006.01)

(52) U.S. Cl.
CPC .......... *H03F 1/0288* (2013.01); *H03F 3/245* (2013.01); *H03F 2200/451* (2013.01); *H03F 2200/468* (2013.01)

(58) Field of Classification Search
CPC ... H03F 1/30; H03F 3/16; H03F 1/305; H03F 3/20; H03G 3/30
See application file for complete search history.

(56) References Cited

U.S. PATENT DOCUMENTS 6,731,173 B1 5/2004 Thompson
7,164,310 B1 1/2007 Nauleau et al.
10,038,404 B1 7/2018 Sarais et al.
10,608,595 B1 3/2020 Maalouf et al.
11,522,286 B2 * 12/2022 Marr, Jr. .............. H03F 1/0211
2016/0127060 A1 5/2016 Cross
2021/0080992 A1 * 3/2021 Maalouf ................ G05F 1/468
2023/0308053 A1 9/2023 Sahu et al.
(Continued)

FOREIGN PATENT DOCUMENTS

JP 2020010095 A 1/2020

OTHER PUBLICATIONS

Chauhan et al.: "A tuning technique for temperature and process variation compensation of power amplifiers with digital predistortion". 2016 IEEE 25th North Atlantic Test Workshop, Providence, RI, USA, Date of Conference: May 9-11, 2016, 8 pages.
(Continued)

*Primary Examiner* — Henry Choe

(57) ABSTRACT

An RF amplifier can be provided with bias control circuitry that includes memory storing stores nominal gate bias voltages for one or more transistors of the amplifier as well as gate bias offset values. The offset values can be used to adjust the gate bias voltage by increasing or reducing the gate bias voltage of the transistor(s) based on a temperature signal received from a temperature sensor. The nominal gate bias voltages and gate bias offset values are determined based upon characterization of the individual transistors of the amplifier and how adjusting the gate bias voltages of these transistors effects the overall performance of the amplifier. The memory is programmed to adjust the gate bias of the transistors to achieved selected performance characteristics such as output linearity, dynamic range, power efficiency, or a selected trade-off between such characteristics over a selected range of operating temperatures.

18 Claims, 4 Drawing Sheets

(56) References Cited

U.S. PATENT DOCUMENTS

2025/0070732 A1 * 2/2025 Kondo .................... H03F 1/305

OTHER PUBLICATIONS

Li et al.: "A WLAN RF CMOS power amplifier with power detector, high harmonic suppression, and temperature compensation"; 2015 European Microwave conference, Paris, France; Date of Conference: Sep. 7-10, 2015; 4 pages.

Texas Instruments; "Temperature Compensation of Power Amplifier F E T Bias Voltages"; Application Report, SLAA946-Apr. 2021 (8 pages).

Dallas Semiconductors MAXIM; "Datasheet LDMOS RF Power-Amplifier Bias Controller DS1870"—Rev 2; 28 pages (Feb. 28, 2006).

* cited by examiner

RADIO-FREQUENCY AMPLIFIERS WITH AUTOMATIC BIAS COMPENSATION

TECHNICAL FIELD

Embodiments of the disclosure are related to transistor-based amplifier circuits for amplifying radio-frequency (RF) signals.

BACKGROUND

Transistor-based amplifiers are commonly used to amplify radio-frequency (RF) signals by biasing a control electrode of one or more transistors using a direct current (DC) voltage. In some amplifiers, additional circuitry is used to dynamically adjust the biasing of one or more transistors in order to maintain a constant DC current level between two current terminals of one or more transistors (e.g., between the source and drain of a field-effect transistor or at a node between a pair of transistors) or in response to measuring the current in a reference transistor or other device positioned near the transistor(s) used for amplification.

BRIEF SUMMARY

In an example embodiment, a radio-frequency amplifier module includes an input node and an output node; a temperature sensor; and a transistor device. The transistor device is configured to receive an RF input signal from the input node and to output a first amplified signal corresponding to the RF input signal to the output node.

The amplifier module also includes control circuitry coupled to the transistor device and memory coupled to the control circuitry. The control circuitry includes analog to digital converter (ADC) circuitry and digital to analog converter (DAC) circuitry. The memory stores a set of digital offset values and the control circuitry is configured to bias a gate terminal of the transistor device at a selected operating point for a first operating temperature of the amplifier module by: receiving a first temperature value from the temperature sensor corresponding to the first operating temperature; determining a location in the memory corresponding to the first temperature value; retrieving, from the location in the memory corresponding to the first temperature value, a first digital offset value from the set of digital offset values stored in the memory; determining a first offset voltage using the first digital offset value determining a bias voltage value that corresponds to a sum of a nominal gate bias voltage of the transistor device and the first offset voltage; and biasing the gate terminal of the transistor device with a gate voltage bias that corresponds to the bias voltage value using the DAC circuitry.

In another example embodiment, a radio-frequency Doherty amplifier module includes an input node and an output node; a temperature sensor; a carrier amplifier device and a peaking amplifier device; control circuitry coupled to the carrier amplifier circuit and the peaking amplifier circuit; and memory coupled to the control circuitry.

The carrier amplifier device and peaking amplifier device are both configured to receive an RF input signal from the input node and to output a first amplified signal corresponding to the RF input signal to the output node;

The control circuitry includes analog to digital conversion (ADC) circuitry and digital to analog conversion (DAC) circuitry. The memory stores a first set of digital offset values and second set of digital offset values. The control circuitry is configured to bias the carrier amplifier and the peaking amplifier at selected operating points for a first operating temperature of the amplifier module.

The control circuitry is configured to receive a first temperature value from the temperature sensor corresponding to the first operating temperature; and determine first and second locations in the memory that correspond to the first temperature value. The control circuitry is further configured to retrieve, from the first location in the memory corresponding to the first temperature value, a first digital offset value from the first set of digital offset values and to retrieve, from the second location in the memory, a second digital offset value from the second set of digital offset values.

The control circuitry is further configured to determine a first offset voltage using the first digital offset value and a second offset voltage using the second digital offset value. The control circuitry is further configured to determine a first bias voltage value that corresponds to a sum of a nominal gate bias voltage for the carrier amplifier and the first offset voltage; and to determine a second gate bias voltage value that corresponds to a sum of a nominal gate bias voltage for the peaking amplifier and the second offset voltage. The control circuitry is further configured to bias the carrier amplifier device with a gate voltage bias that corresponds to the first bias voltage value using the DAC circuitry; and to bias the peaking amplifier device with a gate voltage bias that corresponds to the second bias voltage value using the DAC circuitry.

BRIEF DESCRIPTION OF THE SEVERAL VIEWS OF THE DRAWINGS

The following Disclosure is illustrated by way of examples, embodiments and the like and is not limited by the accompanying Figures, in which like reference numbers indicate similar elements. The Figures along with the detailed description are incorporated and form part of the specification and serve to further illustrate examples, embodiments and the like, and explain various principles and advantages, in accordance with the disclosure.

DETAILED DESCRIPTION

Figure 1:
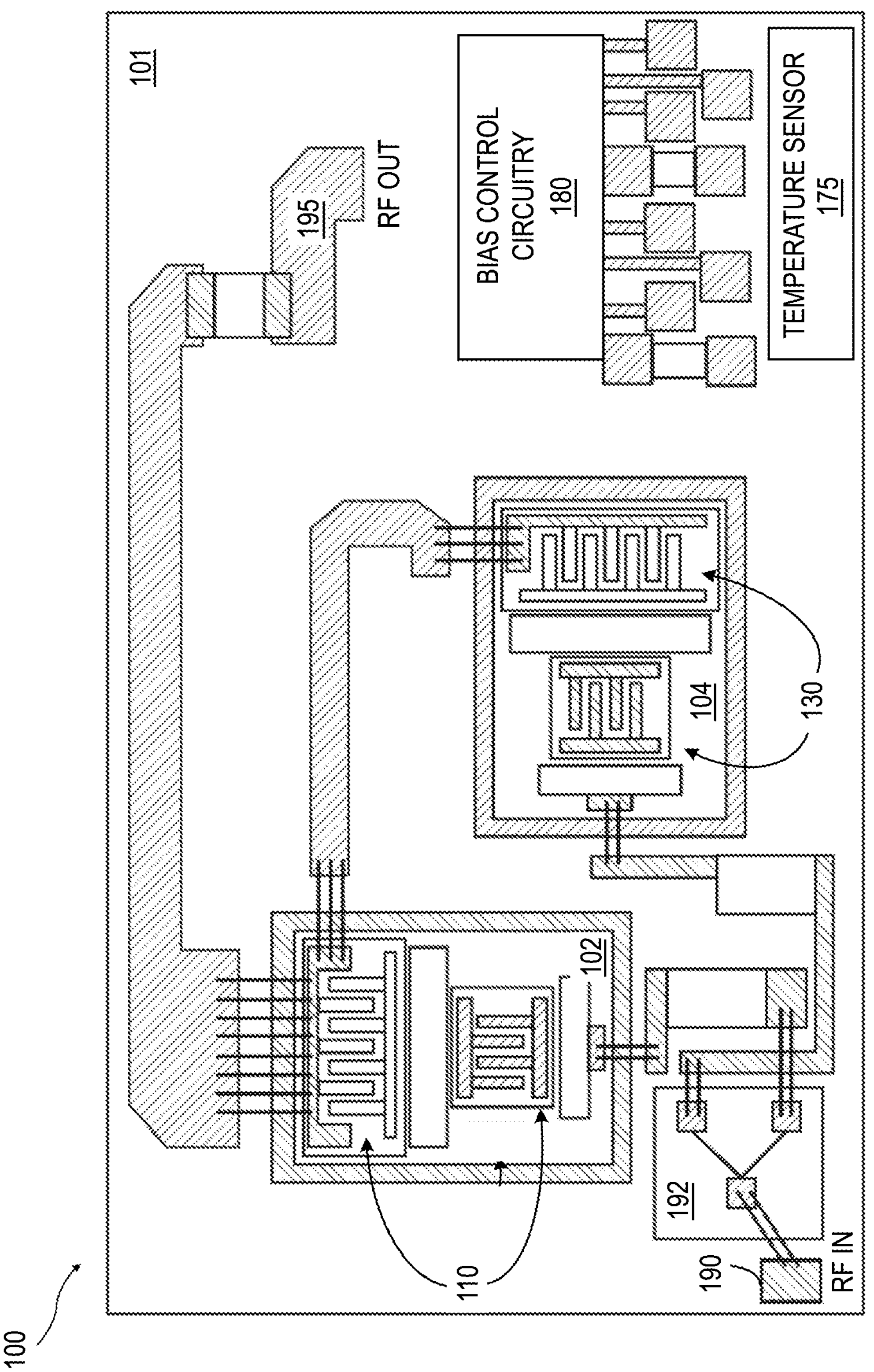
FIG. 1 is a plan view of an example amplifier module according to one or more embodiments herein.

The following Detailed Description provides examples for the purposes of understanding and is not intended to limit the embodiments of this disclosure and uses of the same. Furthermore, there is no intention to be bound by any expressed or implied theory presented in the preceding technical field, background, or the following detailed description.

For simplicity and clarity of illustration, elements in the Drawings are not necessarily drawn to scale. For example, the dimensions of some of the elements or regions in the figures may be exaggerated relative to other elements or regions to help improve understanding of embodiments of the invention. Directional references such as “top,” “bottom,” “left,” “right,” “above,” “below,” and so forth, unless otherwise stated, are not intended to require any preferred orientation, and are made with reference to the orientation of the corresponding figure or figures for purposes of illustration. In addition, the Figures and Detailed Description may omit well-known and conventional features for clarity.

Previous approaches to bias compensation in transistor amplifier circuits can have disadvantages. For example, laterally-diffused metal-oxide-semiconductor (LDMOS) transistors and gallium nitride high electron mobility transistors (HEMTs) are increasingly being used for their high-power handling capabilities. However, device-to-device variability due to manufacturing variation and due to non-uniform defects, particularly in gallium nitride layers, can make it difficult to effectively compensate for temperature variations using reference transistors placed near transistors forming part of an amplifier circuit. In addition, other approaches using external temperature sensors and predetermined temperature compensation curves have sought to adjust transistor bias voltages to maintain a constant current (e.g., a constant drain-to-source current). However, such approaches are insufficient for achieving system-level performance objectives such as output linearity and power efficiency, particularly in amplifier modules which use multiple transistor stages, multiple amplification paths for different power regimes, or both (e.g., multistage Doherty amplifiers).

Accordingly, embodiments herein provide for amplifiers with bias control circuitry that includes memory which stores nominal gate bias voltages for one or more transistors of the amplifier as well as gate bias offset values. The offset values that can be used to adjust the gate bias voltage by increasing or reducing the gate bias voltage of the transistors based on a temperature signal received from a temperature sensor. The nominal gate bias voltages and gate bias offset values are determined based upon characterization of the individual transistors of the amplifier and how adjusting the gate bias voltages of these transistors effects the overall performance of the amplifiers. The memory is programmed to adjust the gate bias of the transistors to achieved selected performance characteristics such as output linearity, dynamic range, power efficiency, or a selected trade-off between such characteristics, as non-limiting examples.

Along these lines, FIG. 1 shows a simplified plan view of an example amplifier module according to embodiments herein with a control circuitry, configured to operate one or more transistors at selected operating points over multiple temperatures within a selected temperature range. Such control circuitry may be referred to as a bias controller or bias control circuitry. The amplifier module 100 shown implements a Doherty amplifier configuration in which two amplifier circuits, typically referred to as a "carrier amplifier" and a "peaking amplifier" are both coupled to the same alternating current (AC) input node 190 (via power splitter 192 and other circuitry that provides impedance matching). The carrier amplifier and the peaking amplifier may also be coupled to the same output terminal 195 in order to provide consistent AC output performance across a wide range of AC signal levels at the input. Embodiments disclosed herein in the context of the amplifier module 100 and other devices are discussed for purposes of illustration only and nothing herein is intended to limit embodiments to use in any particular amplifier circuit or other electronic device. It will be further appreciated that transistors may be described herein as field effect transistors for purposes of illustration only and that any suitable transistors can be used in embodiments herein.

As shown, the circuitry of the amplifier module 100 is constructed on a carrier 101 (e.g., a substrate such as a printed circuit board or other suitable carrier, such as a polymer substrate, ceramic substrate, or another substrate material) that includes individual semiconductor die 102, 104, which may be attached (e.g., soldered) to thermally and electrically-conductive die pads in the carrier 101. Terminals of the semiconductor dies 102 and 104 are wire-bonded to conductive traces on the carrier 101. In this example, a first semiconductor die 102 (e.g., a peaking amplifier of a Doherty amplifier) includes one or more primary transistors 110 (i.e., transistors configured for use as amplifier transistors or other active devices requiring controlled biasing to operate the transistors at a selected operating point) and suitable metal traces (not shown) to electrically couple the primary transistor(s) 110 to bond pads or terminals (not shown), which are in turn electrically coupled by wire bonds to conductive traces (not shown) on the carrier 101. The amplifier module 100 also includes a second semiconductor die 104 (e.g., a main or carrier amplifier of a Doherty amplifier) with one or more additional primary transistors 130 that are similarly coupled via wire bonds to conductive traces (not shown) on the carrier 101.

The amplifier module 100 also includes a temperature sensor 175 coupled to bias control circuitry 180. The temperature sensor 175 outputs a temperature signal (e.g., an analog voltage that is proportional to or otherwise indicative of a temperature of the environment surrounding of the sensor). In one or more embodiments, the temperature sensor 175 is formed on or otherwise contacts a surface of a carrier such as the carrier 101.

The bias control circuitry 180 is configured to control operation of the transistor(s) 110 and transistor(s) 130 by applying appropriate DC bias voltages to the gate terminals (or other control terminal) of each transistor such that they are operated at selected operating points (i.e., a combination of bias conditions that are associated with selected performance characteristics such as amplifier gain, linearity, distortion, and so on). In one or more embodiments, control circuitry such as the bias control circuitry 180 is configured to adjust the DC gate bias voltage supplied to the gate terminal of one or more of the transistors in response to a temperature signal received from a temperature sensor such as the temperature sensor 175, as will be described further below in connection with FIG. 2.

Figure 2:
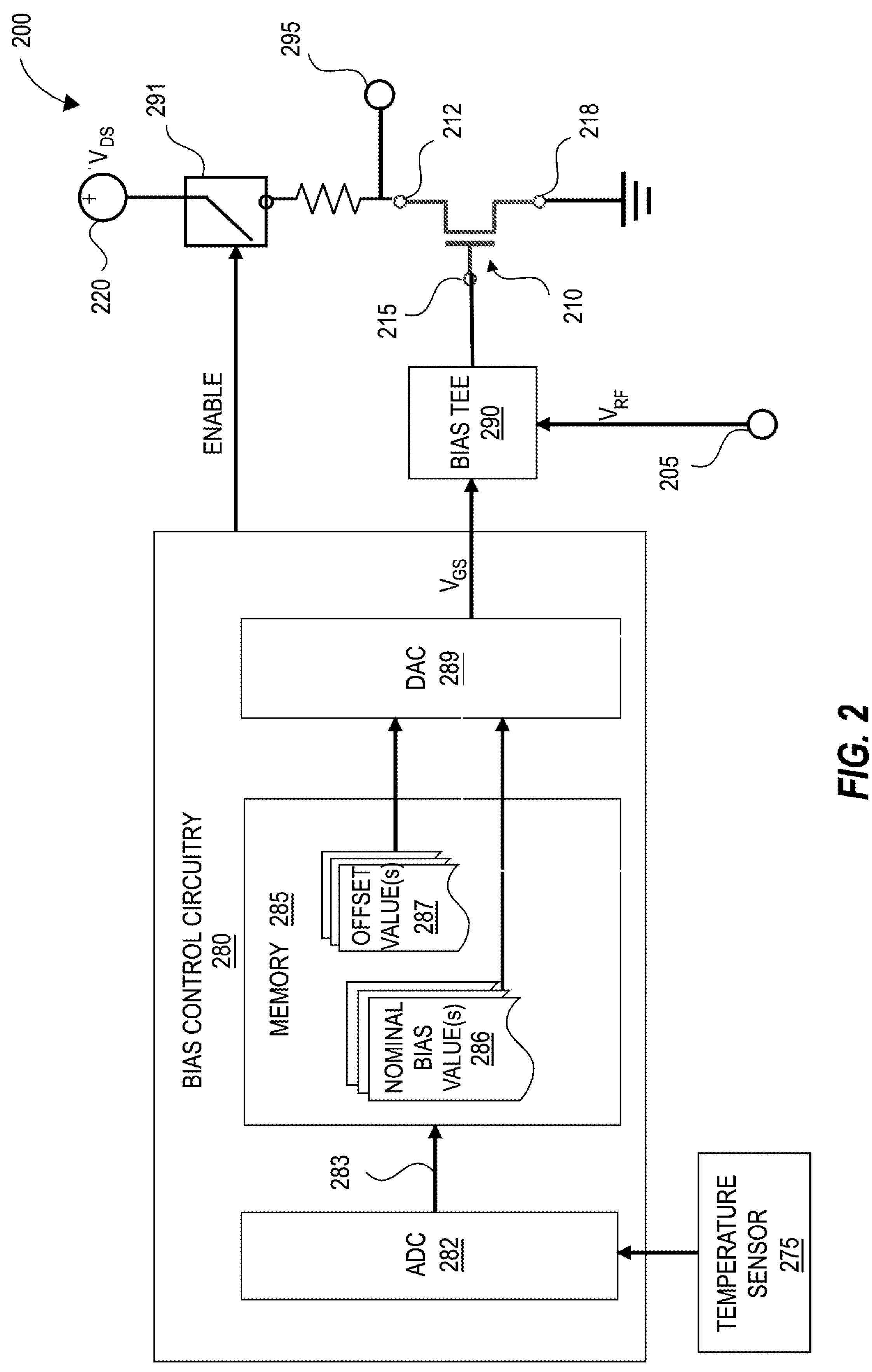
FIG. 2 is a block level circuit diagram of an amplifier module according to one or more embodiments herein.

FIG. 2 is a simplified block-level circuit diagram of a portion of an example circuit including an amplifier and control circuitry configured to dynamically adjust the gate voltage of a transistor according to one or more embodiments. It will be understood that the amplifier 200 is an example for purposes of illustration. Additionally, it should be understood that devices according to embodiments herein can include any suitable number of transistors, such as the transistors 110 or 130 in FIG. 1, in any suitable arrangement controlled by any suitable number of bias controllers such as the bias control circuitry 180 in FIG. 1 or the bias control circuitry 280 as described further below. For instance, in one or more embodiments, an amplifier incorporates a single bias controller similar to the bias control circuitry 280 that is configured to control multiple transistors in the manner described. Alternatively, in one or more embodiments, an amplifier included multiple instances of bias control circuit such as the bias control circuitry 280, with each instance configured to control a respective transistor.

As shown in FIG. 2, the amplifier 200 includes an input node 205 (e.g., an input node 190) and an output node 295 (e.g., an output node 195) coupled to a transistor 210 (e.g., a transistor 110 or a transistor 130). It will be understood that the amplifier 200 may form part of packaged amplifier module (e.g., the amplifier module 100). The transistor 210 has a first current terminal (i.e., a drain 212), a second current terminal (i.e., a source 218), and a control terminal (i.e., a gate 215). Radio-frequency (RF) signals denoted by $V_{RF}$ and a gate bias voltage (denoted by $V_{GS}$) are coupled to the gate 215 via the bias tee 290 or any other suitable circuitry. In some applications, a bias controller or other circuitry may enable or disable one or more transistors (e.g., a "receive" amplifier circuit might be disabled while a nearby "transmit" amplifier circuit is being used to transmit). Thus, in the example of FIG. 2, the drain 212 of the transistor 210 is coupled to a voltage source 220 ($V_{DS}$) via a switch 291 which is controlled by an "enable" signal generated by the bias control circuitry 280. Although only one transistor 210 is shown in FIG. 2, it should be appreciated that the illustrated example depicts a portion of the example circuit, which may include multiple transistors 210.

The bias control circuitry 280 includes analog-to-digital converter circuitry (the ADC 282), memory 285, and digital-to-analog converter (DAC) circuitry operable as a programmable voltage source (the DAC 289). The memory 285 stores nominal bias value(s) 286 and offset values 287 for each transistor controlled by the bias control circuitry 280.

A nominal bias value 286 corresponds to a selected gate bias voltage for the transistor 210 at a reference temperature (e.g., 25° C. or any other suitable temperature). Memory such as the memory 285 included in or otherwise coupled to control circuitry such as the bias controller 280 can store multiple nominal bias values 286. For example, in one or more embodiments, control circuitry such as the bias control circuitry 280 stores different nominal bias values corresponding to different selected operating points of a transistor (e.g., corresponding to different operational modes of an amplifier such as the amplifier 200 or the amplifier module 100) in a memory such as the memory 285. Along similar lines, a control circuitry such as the bias controller 280 can be configured to provide biasing for multiple transistors and to store one or more nominal bias values for each transistor in the memory.

The bias control circuitry 280 is configured to receive a temperature signal that is proportional to or otherwise indicative of the temperature of the ambient environment from the temperature sensor 275 (e.g., a temperature sensor 175). In this example, the temperature sensor 275 outputs an analog voltage indicative of the temperature and may provide the analog voltage to the ADC 282, which converts the analog voltage to a digital temperature value 283. The bias control circuitry 280 uses the digital temperature value 283 and the offset values 287 stored in the memory 285 to determine an appropriate gate bias voltage ($V_{GS}$). In particular, the bias control circuitry 280 may determine an offset value 287 for the transistor 210 from the memory 285 based on the digital temperature value 283 and may provide the offset value 287 and the nominal bias value 286 for the transistor 210 to the DAC 289, to produce an analog voltage based on the offset value 287 and the nominal bias value 286 that is suitable to bias the transistor 210 at the determined temperature. It will be understood that control circuitry such as the bias control circuitry 280 can determine appropriate offset values 287 to retrieve from memory such as the memory 285 in any suitable manner. For example, in one or more embodiments, offset values such as the offset values 287 are organized as a lookup table stored in memory and the appropriate offset value is retrieved based on the temperature value.

Along these lines, in one or more embodiments, control circuitry such as the bias control circuitry 280 is configured to periodically poll a temperature value, such as the temperature value 283 generated by the ADC 282. In one or more such embodiments, after receiving an updated temperature value, the bias control circuitry causes a programmable voltage source such as the DAC 289 to adjust a nominal bias value for a transistor such as the transistor 210 by an amount corresponding to an offset value such as an offset value 287 and to apply the corresponding analog voltage to the transistor.

It will be appreciated that the architecture described above in which the memory 285 stores both nominal bias value(s) 286 and offset values 287 for one or more transistors can have certain advantages. For example, for a given dynamic range of the DAC 289 and word size of the memory 285, the offset values 287 can be represented with greater resolution, allowing the gate bias of a transistor such as the transistor 210 can be adjusted with greater precision than if the memory 285 were configured to store only the selected value of the gate bias voltage ($V_{GS}$) for each temperature in selected operating range of an amplifier such as the amplifier 200.

Figure 3:
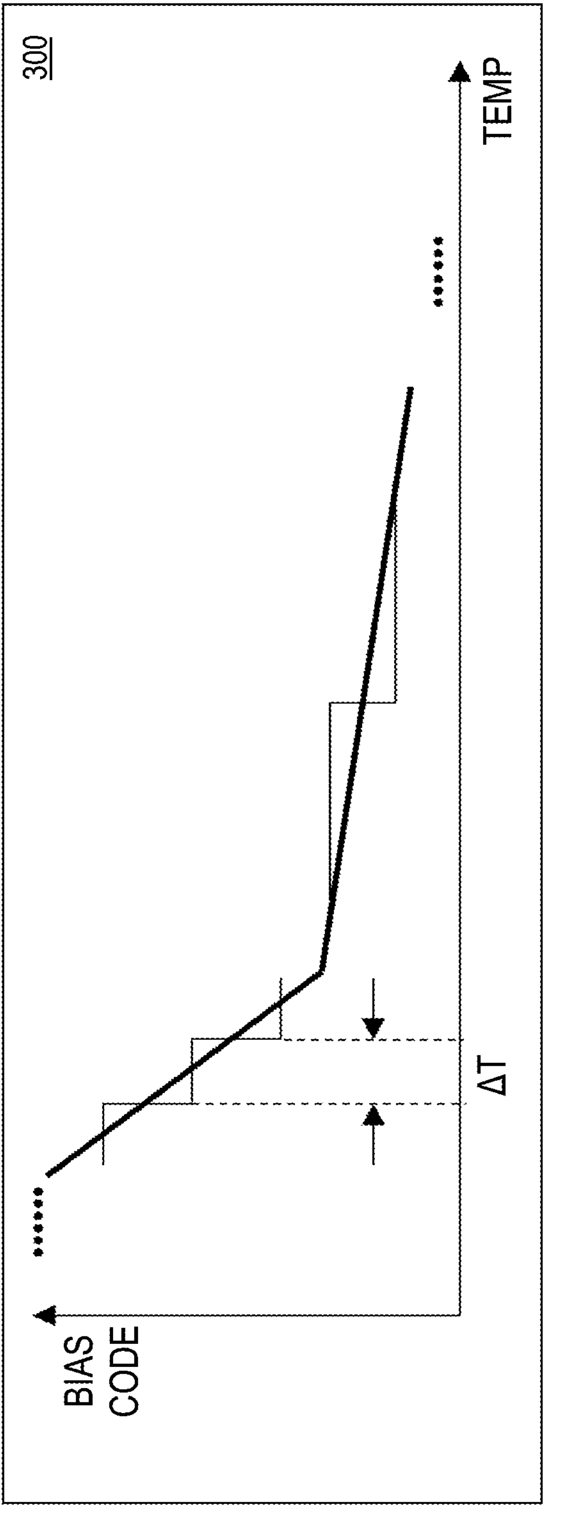
FIG. 3 is a plot illustrating a bias compensation scheme according to one or more embodiments.

FIG. 3 is a plot illustrating an example bias control scheme according to one or more embodiments, which can be implemented by a bias controller such as the bias control circuitry 180 or a bias control circuitry 280. In this example, which will be described in connection with the 280 of FIG. 2, bias codes (e.g., digital values corresponding to offset values 287) are stored in memory of the bias control circuitry. Each bias code corresponds to a "bin" of temperatures having a width $\Delta T$. The bias control circuitry 280 receives the temperature value 283 and uses it to determine a location in the memory 285 that stores an appropriate offset values 287. In one or more embodiments, the bias control circuitry 280 applies the appropriate gate bias voltage $V_{GS}$ by converting the nominal bias value 286 and the appropriate offset values 287 to the selected analog voltage $V_{GS}$. The offset values 287 may be stored in any suitable fashion. In one nonlimiting example, the offset values 287 are stored in a look up table that is indexed by a digital value corresponding to each temperature bin.

In one or more embodiments, the width of the bins corresponding to each offset value 287 are not uniform; that is, some bins may have a larger value of $\Delta T$ than other bins. In one or more embodiments, control circuitry such as the bias controller 280 is configured to exhibit temperature hysteresis. That is, the bias controller is configured to change the gate bias voltage applied to a transistor only when the temperature indicated by a temperature value such as the temperature value 283 differs from the temperature indicated by a previous value by more than a predetermined amount.

In one or more embodiments, control circuitry such as the bias control circuitry 280 implements a piecewise-linear scheme for adjusting the gate bias of a transistor such as the transistor 210. As shown in FIG. 3, the bias control circuitry can retrieve an offset value 287 corresponding to an edge or midpoint of a temperature bin and interpolate between the measured temperature sensor and the nearest stored offset values 287. It will be understood that, in one or more embodiments, different interpolation schemes are used that need not be linear.

In some applications it can be desirable to limit the frequency with which control circuitry such as the bias control circuitry 280 adjusts the gate bias voltage of a transistor such as the transistor 210. For instance, an amplifier module may include separate amplification circuitry corresponding to a transmitter circuit and a receiver circuit. The transmitter and receiver may be active at different times and it may be desirable to maintain a constant gate bias voltage for one or more transistors during a period in which the corresponding circuit is active. Accordingly, in one or more embodiments, control circuitry such as the bias control circuitry 280 is configured to wait for a period during which a transistor circuit is deactivated before changing the gate bias voltage applied to the transistor. As one example, the bias control circuitry 280 may receive a control signal indicating that the transistor 210 is to be deactivated. The bias control circuitry 280 can disable the transistor 210 (e.g., by setting the 'ENABLE' signal to a value that causes the switch 291 to decouple the transistor 210 from the voltage source 220) before determining a new value of $V_{GS}$, followed by setting the 'ENABLE' signal to a value that causes the switch 291 to couple the transistor 210 to the voltage source 220).

Figure 4:
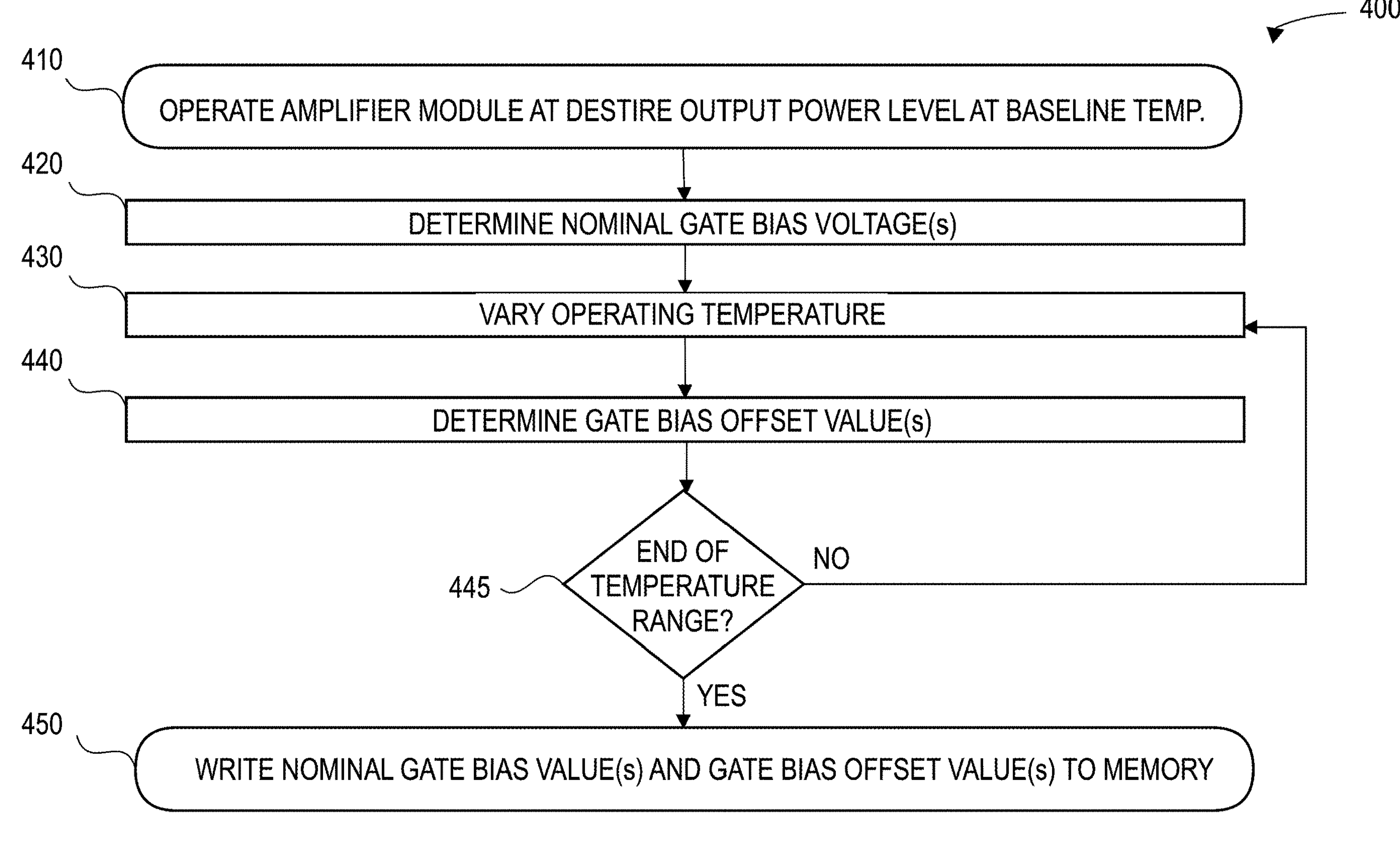
FIG. 4 is a flow chart illustrating steps in an example method for configuring bias control circuitry of an amplifier module according to one or more embodiments.

FIG. 4 is a process flow diagram illustrating a simplified example process for configuring the memory of bias control circuitry such as bias control circuitry 180 in FIG. 1 or the bias control circuitry 280 of FIG. 2 forming part of an amplifier module according to one or more embodiments. The process 400 includes the steps 410, 420, 430, 440, 445, and 450. It will be understood that the process 400 is an example for purposes of illustration and that embodiments herein can perform processes related to the process 400 that omit steps of the process 400, add additional steps, perform the steps of the process 400 in a different order, and so on.

The process 400 begins at step 410 in which an amplifier module (e.g., an amplifier module 100 or an amplifier 200) is operated at a selected output power level at a baseline temperature. As above, the amplifier module can include any suitable number of signal paths, each having any suitable number of transistor stages.

At step 420, the nominal gate voltage(s) (e.g., nominal bias value(s) 286) are determined by varying the gate voltages of one or more transistors and measuring the resulting changes in the performance of the amplifier module. It will be appreciated that any suitable procedure can be used to determine the nominal gate voltage(s) and that procedures used to determine the nominal gate voltages can depend upon the design of the circuit(s) and performance characteristics the device manufacturer or user wishes to optimize.

At step 430, the operating temperature of the amplifier module is adjusted, and the process 400 proceeds to step 440. At step 440 the selected gate bias voltages for the new temperature are determined. The selected gate bias voltages are represented as gate bias offset values (e.g., offset values 287 relative the nominal gate bias voltages determined at step 420).

Next, at step 445, the process 400 returns to step 430 until the amplifier module has been characterized over the entire selected range of operating temperatures. Once the amplifier module has been characterized over all the selected temperatures, the process 400 concludes at step 450 in which the nominal bias values 286 and the bias offset values 287 are written to the memory.

Nominal gate bias values (e.g., nominal bias value(s) 286) and gate bias offset values (e.g., offset values 287) may be determined according to any suitable method to achieve selected performance characteristics across different temperatures. For example, in some applications it is desirable to optimize the linearity of an amplifier module (e.g., an amplifier module 100 or an amplifier 200), while in other applications, it may be desirable to optimize a performance metric such as the power-added efficiency (PAE), which is expressed as $$\frac{P_{out} - P_{in}}{P_{DC}}$$

where $P_{in}$ is the RH input power, $P_{out}$ is the RF output power of the amplified input signal and $P_{DC}$ is the steady-state power supplied to bias the amplifier. It will be appreciated that other measurements can be related to linearity or power efficiency. For example, one such metric is adjacent channel power, or "ACP" (the amount of output power at frequencies outside the intended operating bandwidth of the amplifier). ACP can also be expressed as a ratio (referred to as adjacent channel power ratio or "ACPR") between the output power within the intended operating bandwidth of the amplifier and the adjacent bandwidth.

Because the overall performance characteristics of a Doherty amplifier module are dependent on the individual of two or more amplification paths configured to operate in different power regimes, it can be particularly desirable that the component transistors in Doherty amplifier modules are biased such that the module transitions smoothly between different input power ranges to reduce undesirable non-linearities which can lead to degraded performance. Thus, it will be appreciated that embodiments herein can be particularly well-suited to Doherty amplifiers and related devices which can include multiple signal paths, each of which can include multiple transistors. In addition, Doherty amplifiers and other devices often incorporate transistors fabricated using different architectures and materials whose performance can have different dependencies on temperature (e.g., some Doherty amplifiers include Silicon-based laterally diffused metal-oxide-semiconductor, or "LDMOS" transistors along with gallium-nitride HEMTs).

EXAMPLES

Features of embodiments may be understood by way of one or more of the following examples.

Example 1: A radio-frequency (RF) amplifier module that includes an input node and an output node; a temperature sensor; and a transistor device. The transistor device is configured to receive an RF input signal from the input node and to output a first amplified signal corresponding to the RF input signal to the output node.

The amplifier module also includes control circuitry coupled to the transistor device and memory coupled to the control circuitry. The control circuitry includes analog to digital converter (ADC) circuitry and digital to analog converter (DAC) circuitry. The memory stores a set of digital offset values and the control circuitry is configured to bias a gate terminal of the transistor device at a selected operating point for a first operating temperature of the amplifier module by: receiving a first temperature value from the temperature sensor corresponding to the first operating temperature; determining a location in the memory corresponding to the first temperature value; retrieving, from the location in the memory corresponding to the first temperature value, a first digital offset value from the set of digital offset values stored in the memory; determining a first offset voltage using the first digital offset value; determining a bias voltage value that corresponds to a sum of a nominal gate bias voltage of the transistor device and the first offset voltage; and biasing the gate terminal of the transistor device with a gate voltage bias that corresponds to the bias voltage value using the DAC circuitry.

Example 2: The amplifier module of Example 1, where the temperature sensor is coupled to an external surface of the amplifier module.

Example 3: The amplifier module of Example 1 or Example 2, where the control circuitry is configured to selectively enable and disable the transistor device; and where the control circuitry is further configured to: apply a constant bias voltage to the gate terminal of the transistor device during periods when the transistor device is enabled; determine, during a period in which the transistor device is disabled, that the operating temperature of the amplifier module has changed; and adjust the bias voltage and apply the adjusted bias voltage to the gate terminal of the transistor device during a subsequent period in which the transistor device is enabled in response to determining that the operating temperature of the amplifier module has changed.

Example 4: The amplifier module of any of Examples 1-3, where the control circuitry is configured to adjust the bias voltage applied to the gate terminal of the transistor device in response to determining that a current operating temperature of the amplifier module differs from a previous operating temperature of the amplifier module by more than a predetermined temperature difference.

Example 5: The amplifier module of any one of Examples 1-4, where the nominal gate bias voltage and the set of digital offset values are configured to cause a performance characteristic of the amplifier to remain within a predetermined specification range of that performance characteristic for operating temperatures within a predetermined operating temperature range.

Example 6: The amplifier module of any of Examples 1-5, where the predetermined operating temperature range corresponds to a range that includes −40° C. and +125° C.

Example 7: The amplifier module of any of Examples 1-6, where the control circuitry is further configured to bias the gate terminal of the transistor device at the selected operating point for the first operating temperature of the amplifier module by: determining, using the temperature signal, a second location in the memory corresponding a second temperature value that indicates a higher or lower operating temperature than the operating temperature; retrieving, from the location in the memory corresponding to the second temperature value, a second digital offset value from the set of digital offset values stored in the memory; determining the offset voltage by interpolating between the first digital offset value and the second digital offset value.

Example 8: The amplifier module of any one of Examples 1-7, The amplifier module, where the control circuitry is further configured to bias the gate terminal of the transistor at the selected operating point for the first operating temperature of the amplifier module by determining that the first digital offset value is associated with a second operating temperature that is higher or lower than the first operating temperature; and calculating a difference value between first the operating temperature and the second operating temperature and; determining the offset voltage by adjusting the first digital offset value by an amount that depends on the difference value.

Example 9: The amplifier module of any of Examples 1-8, where the first temperature value is a digital value. Determining the location in the memory corresponding to the first temperature value includes using the ADC circuitry to convert the temperature signal into the first temperature value.

Example 10: A radio-frequency (RF) Doherty amplifier module that includes an input node and an output node; a temperature sensor; a carrier amplifier device and a peaking amplifier device. Both the carrier amplifier device and the peaking amplifier device are configured to receive an RF input signal from the input node and to output a first amplified signal corresponding to the RF input signal to the output node. The Doherty amplifier module includes control circuitry coupled to the carrier amplifier device and the peaking amplifier device and memory coupled to the control circuitry.

The control circuitry includes analog to digital conversion (ADC) circuitry and digital to analog conversion (DAC) circuitry. The memory stores a first set of digital offset values and second set of digital offset values and the control circuitry is configured to bias the carrier amplifier device and the peaking amplifier device at selected operating points for a first operating temperature of the amplifier module by: receiving a first temperature value from the temperature sensor corresponding to the first operating temperature; determining first and second locations in the memory that correspond to the first temperature value; retrieving, from the first location in the memory corresponding to the first temperature value, a first digital offset value from the first set of digital offset values and retrieving, from the second location in the memory, a second digital offset value from the second set of digital offset values; determining a first offset voltage using the first digital offset value and a second offset voltage using the second digital offset value; determining a first bias voltage value that corresponds to a sum of a nominal gate bias voltage for the carrier amplifier and the first offset voltage; determining a second gate bias voltage value that corresponds to a sum of a nominal gate bias voltage for the peaking amplifier and the second offset voltage; biasing the carrier amplifier device with a gate voltage bias that corresponds to the first bias voltage value using the DAC circuitry; and biasing the peaking amplifier device with a gate voltage bias that corresponds to the second bias voltage value using the DAC circuitry.

Example 11: The Doherty amplifier module of Example 10, where the temperature sensor is coupled to an external surface of the amplifier module.

Example 12: The Doherty amplifier module of Example 10 or Example 11, where the control circuitry is configured to selectively enable and disable the peaking amplifier device; and where the control circuitry is further configured to: apply a constant gate bias voltage to the peaking amplifier device of the transistor during periods when the peaking amplifier device is enabled; determine, during a period in which the peaking amplifier device is disabled, that the operating temperature of the amplifier module has changed; and adjust the gate bias voltage to an adjusted gate bias voltage value applied to the peaking amplifier device during a subsequent period in which the transistor is enabled in response to determining that the operating temperature of the amplifier module has changed.

Example 13: The amplifier module of any of Examples 10-12, where the control circuitry is configured to selectively enable and disable the carrier amplifier device; and where the control circuitry is further configured to: apply a constant gate bias voltage to the carrier amplifier device of the transistor during periods when the carrier amplifier device is enabled. The control circuitry is also configured to determine, during a period in which the carrier amplifier device is disabled, that the operating temperature of the amplifier module has changed; and adjust the gate bias voltage applied to the carrier amplifier to an adjusted gate bias voltage value and apply the adjusted gate voltage to the carrier amplifier device during a subsequent period in which the carrier amplifier device is enabled in response to determining that the operating temperature of the amplifier module has changed.

Example 14: The Doherty amplifier module of any of Examples 10-13, where the control circuitry is configured to adjust the bias voltage applied to the carrier amplifier device or the gate bias voltage applied to the peaking amplifier device in response to determining that a current operating temperature of the amplifier module differs from a previous operating temperature of the amplifier module by more than a predetermined temperature difference.

Example 15: The Doherty amplifier module of any one of Examples 10-14, where the nominal gate bias voltage for the peaking amplifier, the nominal gate bias voltage for the peaking amplifier and the first and second sets of digital offset values are configured to cause a performance characteristic of the amplifier to remain within a predetermined specification range of that performance characteristic for operating temperatures within a predetermined operating temperature range.

Example 16: The Doherty amplifier module of any one of Examples 10-15, where the predetermined operating temperature range corresponds to a range that includes −40 C. and +125 C.

Example 17: The amplifier module of any one of Examples 10-16, where the performance characteristic is an adjacent channel power ratio (APCR) and the amplifier module is configured to exhibit an APCR that is between −4 dB and +4 dB relative to a nominal APCR value of the amplifier module when the output power is between −0.5 dB and +0.5 dB relative to a nominal output power specification of the amplifier module, over the predetermined temperature operating range.

Example 18: The Doherty amplifier module of any one of Examples 10-17, where the performance characteristic is an adjacent channel power ratio (APCR) and the amplifier module is configured to exhibit an APCR that is between −2 dB and +2 dB relative to a nominal APCR value of the amplifier module when the output power is between −0.5 dB and +0.5 dB relative to a nominal output power specification of the amplifier module, over the predetermined temperature operating range.

The preceding detailed description and Figures referenced therein are examples. They are illustrative in nature and are not intended to limit the embodiments of the Disclosure and uses of such embodiments. It should therefore be understood that embodiments of this Disclosure are not limited in their application to the details of construction and the arrangement of components set forth in the preceding Description or illustrated in the accompanying Figures.

The connecting lines shown in the various figures contained herein are intended to represent exemplary functional relationships and/or physical couplings between the various elements. It should be noted that many alternative or additional functional relationships or physical connections may be present in one or more embodiments of the Disclosure.

As used herein, the word “exemplary” means “serving as an example, instance, or illustration.” Any implementation described herein as exemplary is not necessarily to be construed as preferred or advantageous over other implementations. Furthermore, there is no intention to be bound by any expressed or implied theory presented in the preceding technical field, background, or detailed description. It is to be understood that other phraseology and terminology used herein is for the purpose of description and should not be regarded as limiting.

The terms “comprise,” “include,” “have” and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. Herein, “A, B, and/or C” is defined as “A or B or C” or any combination of A, B, or C.

As used herein, unless expressly stated otherwise, “connected” means that one element is directly joined to (or directly communicates with) another element in an electrical or non-electrical manner, and not necessarily mechanically. Likewise, unless expressly stated otherwise, “coupled” means that one element is directly or indirectly joined to (or directly or indirectly communicates with) another element in an electrical or non-electrical manner, and not necessarily mechanically. Thus, although the schematic illustrations of the figures may depict exemplary arrangements of elements, additional intervening elements, devices, features, or components may be present in one or more embodiments of the depicted subject matter.

The terms “first,” “second” and other such numerical terms referring to structures do not imply a sequence or order unless clearly indicated by the context. Thus, the terms “first,” “second,” “third,” “fourth” and the like in the description and the claims, if any, may be used for distinguishing between similar elements and not necessarily for describing a particular sequential or chronological order. It is to be understood that numerical terms used herein are interchangeable under appropriate circumstances such that the embodiments of the invention described herein are, for example, capable of operation in sequences other than those illustrated or otherwise described herein.

Although steps of method(s) described herein may be shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

As used herein the terms “approximate,” “approximately,” “substantial” and “substantially” mean sufficient to accomplish the stated purpose in a practical manner and that minor imperfections, if any, are not significant for the stated purpose. Along these lines, when used with references to measurable quantities including, but not limited to, dimensions, these terms mean that the quantities are equal to the values stated subject to accepted tolerances of any methods or apparatus chosen to fabricate the described structures or measure the quantities or dimensions described.

As used herein the terms “circuit” and “circuitry,” including the term “processing circuitry” and related terminology means any suitable combination(s) of analog or digital circuit elements, hardware, firmware, software, and the like; including but not limited to, application-specific integrated circuits (ASICs), field programmable gate arrays (FPGAs), microcontrollers, and microprocessors. It will be understood that the term “circuitry” encompasses nonvolatile and volatile memory devices including, but not limited to random access memory (RAM), read-only memory (ROM), and the like, which can be implemented using any suitable devices, such as SRAM, DRAM, or magnetic storage devices as non-limiting examples. Along these lines it will be understood that references to a “processor” or “processing circuitry” can include devices in which general purpose computing devices includes or is otherwise coupled to memory which stores machine-readable instructions configured to cause the processing circuitry to perform the described actions. Such instructions can be stored as instructions in a high-level programming language that are interpreted or compiled into object code or machine language, or they may be stored directly as object code or another suitable representation, as nonlimiting examples.

It will be further understood that, unless explicitly stated otherwise, that features such as processing circuitry, memory, and related circuitry and devices can be implemented by any suitable combinations of one or more localized devices including, but not limiting to distributed systems formed by multiple distinct devices in communication with each other via direct electrical communication connections, wireless communication connections, and via public or private communication networks including the Internet. It will further be understood processing circuitry and related devices may be implemented by one or more physical machines or by virtual machines including, but not limited to, virtualized computing environments provided within a "cloud" computing environment or other virtualization systems.

While at least one exemplary embodiment has been presented in the foregoing detailed description, it should be appreciated that a vast number of variations exist. It should also be appreciated that exemplary embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A radio-frequency (RF) amplifier module comprising:
an input node and an output node;
a temperature sensor;
a transistor device configured to receive an RF input signal from the input node and to output a first amplified signal corresponding to the RF input signal to the output node;
control circuitry coupled to the transistor device, wherein the control circuitry includes analog to digital converter (ADC) circuitry and digital to analog converter (DAC) circuitry; and
memory coupled to the control circuitry, the memory storing a set of digital offset values;
wherein the control circuitry is configured to bias a gate terminal of the transistor device at a selected operating point for a first operating temperature of the amplifier module by:
receiving a first temperature value from the temperature sensor corresponding to the first operating temperature;
determining a location in the memory corresponding to the first temperature value;
retrieving, from the location in the memory corresponding to the first temperature value, a first digital offset value from the set of digital offset values stored in the memory;
determining a first offset voltage using the first digital offset value;
determining a bias voltage value that corresponds to a sum of a nominal gate bias voltage of the transistor device and the first offset voltage; and
biasing the gate terminal of the transistor device with a gate voltage bias that corresponds to the bias voltage value using the DAC circuitry.

2. The amplifier module of claim 1, wherein the temperature sensor is coupled to an external surface of the amplifier module.

3. The amplifier module of claim 1, wherein the control circuitry is configured to selectively enable and disable the transistor device; and
wherein the control circuitry is further configured to:
apply a constant bias voltage to the gate terminal of the transistor device during periods when the transistor device is enabled;
determine, during a period in which the transistor device is disabled, that the operating temperature of the amplifier module has changed; and
adjust the bias voltage and apply the adjusted gate bias voltage to the gate terminal of the transistor device during a subsequent period in which the transistor device is enabled in response to determining that the operating temperature of the amplifier module has changed.

4. The amplifier module of claim 1, wherein the control circuitry is configured to adjust the bias voltage applied to the gate terminal of the transistor device in response to determining that a current operating temperature of the amplifier module differs from a previous operating temperature of the amplifier module by more than a predetermined temperature difference.

5. The amplifier module of claim 1, wherein the nominal gate bias voltage and the set of digital offset values are configured to cause a performance characteristic of the amplifier to remain within a predetermined specification range of that performance characteristic for operating temperatures within a predetermined operating temperature range.

6. The amplifier module of claim 5, wherein the predetermined operating temperature range corresponds to a range that includes −40° C. and +125° C.

7. The amplifier module of claim 1, wherein the control circuitry is further configured to bias the gate terminal of the transistor device at the selected operating point for the first operating temperature of the amplifier module by:
determining, using the temperature signal, a second location in the memory corresponding a second temperature value that indicates a higher or lower operating temperature than the operating temperature;
retrieving, from the location in the memory corresponding to the second temperature value, a second digital offset value from the set of digital offset values stored in the memory;
determining the offset voltage by interpolating between the first digital offset value and the second digital offset value.

8. The amplifier module of claim 1, wherein the control circuitry is further configured to bias the gate terminal of the transistor at the selected operating point for the first operating temperature of the amplifier module by:
determining that the first digital offset value is associated with a second operating temperature that is higher or lower than the first operating temperature; and
calculating a difference value between first the operating temperature and the second operating temperature;

determining the offset voltage by adjusting the first digital offset value by an amount that depends on the difference value.

9. The amplifier module of claim 1, wherein the first temperature value is a digital value; and wherein determining the location in the memory corresponding to the first temperature value includes using the ADC circuitry to convert the temperature signal into the first temperature value.

10. A radio-frequency (RF) Doherty amplifier module comprising:

an input node and an output node;

a temperature sensor;

a carrier amplifier device and a peaking amplifier device, both configured to receive an RF input signal from the input node and to output a first amplified signal corresponding to the RF input signal to the output node;

control circuitry coupled to the carrier amplifier circuit and the peaking amplifier circuit, wherein the control circuitry includes analog to digital conversion (ADC) circuitry and digital to analog conversion (DAC) circuitry; and memory coupled to the control circuitry that stores a first set of digital offset values and second set of digital offset values;

wherein the control circuitry is configured to bias the carrier amplifier and the peaking amplifier at selected operating points for a first operating temperature of the amplifier module by:

receiving a first temperature value from the temperature sensor corresponding to the first operating temperature;

determining first and second locations in the memory that correspond to the first temperature value;

retrieving, from the first location in the memory corresponding to the first temperature value, a first digital offset value from the first set of digital offset values and retrieving, from the second location in the memory, a second digital offset value from the second set of digital offset values;

determining a first offset voltage using the first digital offset value and a second offset voltage using the second digital offset value;

determining a first bias voltage value that corresponds to a sum of a nominal gate bias voltage for the carrier amplifier and the first offset voltage;

determining a second gate bias voltage value that corresponds to a sum of a nominal gate bias voltage for the peaking amplifier and the second offset voltage;

biasing the carrier amplifier device with a gate voltage bias that corresponds to the first bias voltage value using the DAC circuitry; and biasing the peaking amplifier device with a gate voltage bias that corresponds to the second bias voltage value using the DAC circuitry.

11. The Doherty amplifier module of claim 10, wherein the temperature sensor is coupled to an external surface of the amplifier module.

12. The Doherty amplifier module of claim 10, wherein the control circuitry is configured to selectively enable and disable the peaking amplifier device; and wherein the control circuitry is further configured to:

apply a constant gate bias voltage to the peaking amplifier device of the transistor during periods when the peaking amplifier device is enabled;

determine, during a period in which the peaking amplifier device is disabled, that the operating temperature of the amplifier module has changed; and adjust the gate bias voltage to an adjusted gate bias voltage value applied to the peaking amplifier device during a subsequent period in which the transistor is enabled in response to determining that the operating temperature of the amplifier module has changed.

13. The amplifier module of claim 10, wherein the control circuitry is configured to selectively enable and disable the carrier amplifier device; and wherein the control circuitry is further configured to:

apply a constant gate bias voltage to the carrier amplifier device of the transistor during periods when the carrier amplifier device is enabled;

determine, during a period in which the carrier amplifier device is disabled, that the operating temperature of the amplifier module has changed; and adjust the gate bias voltage applied to the carrier amplifier to an adjusted gate bias voltage value and apply the adjusted gate voltage to the carrier amplifier device during a subsequent period in which the carrier amplifier device is enabled in response to determining that the operating temperature of the amplifier module has changed.

14. The Doherty amplifier module of claim 10, wherein the control circuitry is configured to adjust the bias voltage applied to the carrier amplifier device or the gate bias voltage applied to the peaking amplifier device in response to determining that a current operating temperature of the amplifier module differs from a previous operating temperature of the amplifier module by more than a predetermined temperature difference.

15. The Doherty amplifier module of claim 10, wherein the nominal gate bias voltage for the peaking amplifier, the nominal gate bias voltage for the peaking amplifier and the first and second sets of digital offset values are configured to cause a performance characteristic of the amplifier to remain within a predetermined specification range of that performance characteristic for operating temperatures within a predetermined operating temperature range.

16. The Doherty amplifier module of claim 15, wherein the predetermined operating temperature range corresponds to a range that includes −40° C. and +125° C.

17. The Doherty amplifier module of claim 16, wherein the performance characteristic is an adjacent channel power ratio (APCR) and the amplifier module is configured to exhibit an APCR that is between −4 dB and +4 dB relative to a nominal APCR value of the amplifier module when the output power is between −0.5 dB and +0.5 dB relative to a nominal output power specification of the amplifier module, over the predetermined temperature operating range.

18. The Doherty amplifier module of claim 17, wherein the performance characteristic is an adjacent channel power ratio (APCR) and the amplifier module is configured to exhibit an APCR that is between −2 dB and +2 dB relative to a nominal APCR value of the amplifier module when the output power is between −0.5 dB and +0.5 dB relative to a nominal output power specification of the amplifier module, over the predetermined temperature operating range.

* * * * *